United States Patent
Michael et al.

(10) Patent No.: US 7,639,861 B2
(45) Date of Patent: Dec. 29, 2009

(54) METHOD AND APPARATUS FOR BACKLIGHTING A WAFER DURING ALIGNMENT

(75) Inventors: David J. Michael, Wayland, MA (US); John B Boatner, Brighton, MA (US); Martin Karnacewicz, Rye, NH (US)

(73) Assignee: Cognex Technology and Investment Corporation, Mt. View, CA (US)

( * ) Notice: Subject to any disclaimer, the term of this patent is extended or adjusted under 35 U.S.C. 154(b) by 698 days.

(21) Appl. No.: 11/162,540

(22) Filed: Sep. 14, 2005

(65) Prior Publication Data

US 2007/0058168 A1      Mar. 15, 2007

(51) Int. Cl.
G06K 9/00 (2006.01)
(52) U.S. Cl. .................................................. 382/141
(58) Field of Classification Search ......... 382/141–151, 382/287, 291, 274; 348/92, 125; 358/504; 700/213; 356/400
See application file for complete search history.

(56) References Cited

U.S. PATENT DOCUMENTS

| | | | |
|---|---|---|---|
| 3,816,722 A | 6/1974 | Sakoe et al. |
| 3,936,800 A | 2/1976 | Ejiri et al. |
| 3,967,100 A | 6/1976 | Shimomura |
| 3,968,475 A | 7/1976 | McMahon |
| 3,978,326 A | 8/1976 | Shimomura |
| 4,011,403 A | 3/1977 | Epstein et al. |
| 4,115,702 A | 9/1978 | Nopper |
| 4,115,762 A | 9/1978 | Akiyama et al. |
| 4,183,013 A | 1/1980 | Agrawala et al. |
| 4,200,861 A | 4/1980 | Hubach et al. |
| 4,238,780 A | 12/1980 | Doemens |
| 4,254,400 A | 3/1981 | Yoda et al. |
| 4,286,293 A | 8/1981 | Jablonowski |
| 4,300,164 A | 11/1981 | Sacks |
| 4,385,322 A | 5/1983 | Hubach et al. |
| 4,435,837 A | 3/1984 | Abernathy |
| 4,441,124 A | 4/1984 | Heebner et al. |
| 4,441,206 A | 4/1984 | Kuniyoshi et al. |
| 4,519,041 A | 5/1985 | Fant et al. |
| 4,534,813 A | 8/1985 | Williamson et al. |
| 4,541,116 A | 9/1985 | Lougheed |

(Continued)

FOREIGN PATENT DOCUMENTS

EP      0265302      9/1987

(Continued)

OTHER PUBLICATIONS

Plessey Semiconductors, *Preliminary Information, Publication No. PS2067*, (May 1986),1 - 5.

(Continued)

*Primary Examiner*—Daniel G Mariam
(74) *Attorney, Agent, or Firm*—George E. Haas

(57) ABSTRACT

A method and apparatus is provided for illuminating a wafer during wafer alignment using machine vision. An illumination device is fabricated using electroluminescent material, that provides diffuse illumination uniformly over the surface of the lamp to provide backlighting of the wafer. Contrast between the image of the wafer and the diffuse illumination produce edge features in the image that can be analyzed to determine the position and orientation of the wafer.

16 Claims, 3 Drawing Sheets

U.S. PATENT DOCUMENTS

| | | | |
|---|---|---|---|
| 4,545,067 A | 10/1985 | Juvin et al. | |
| 4,570,180 A | 2/1986 | Baier et al. | |
| 4,577,344 A | 3/1986 | Warren et al. | |
| 4,581,762 A | 4/1986 | Lapidus et al. | |
| 4,606,065 A | 8/1986 | Beg et al. | |
| 4,617,619 A | 10/1986 | Gehly | |
| 4,630,306 A | 12/1986 | West et al. | |
| 4,631,750 A | 12/1986 | Gabriel et al. | |
| 4,641,349 A | 2/1987 | Flom et al. | |
| 4,688,088 A | 8/1987 | Hamazaki et al. | |
| 4,697,075 A * | 9/1987 | Roos et al. | 250/214 VT |
| 4,706,168 A | 11/1987 | Weisner | |
| 4,707,647 A | 11/1987 | Coldren et al. | |
| 4,728,195 A | 3/1988 | Silver | |
| 4,730,260 A | 3/1988 | Mori et al. | |
| 4,731,858 A | 3/1988 | Grasmueller et al. | |
| 4,736,437 A | 4/1988 | Sacks et al. | |
| 4,742,551 A | 5/1988 | Deering | |
| 4,752,898 A | 6/1988 | Koenig | |
| 4,758,782 A | 7/1988 | Kobayashi | |
| 4,764,870 A | 8/1988 | Haskin | |
| 4,771,469 A | 9/1988 | Wittenburg | |
| 4,776,027 A | 10/1988 | Hisano et al. | |
| 4,782,238 A | 11/1988 | Radl et al. | |
| 4,783,826 A | 11/1988 | Koso | |
| 4,783,828 A | 11/1988 | Sadjadi | |
| 4,783,829 A | 11/1988 | Miyakawa et al. | |
| 4,803,735 A | 2/1989 | Nishida et al. | |
| 4,809,077 A | 2/1989 | Norita et al. | |
| 4,821,333 A | 4/1989 | Gillies | |
| 4,831,580 A | 5/1989 | Yamada | |
| 4,860,374 A | 8/1989 | Murakami et al. | |
| 4,860,375 A | 8/1989 | McCubbrey et al. | |
| 4,876,457 A | 10/1989 | Bose | |
| 4,876,728 A | 10/1989 | Roth | |
| 4,891,767 A | 1/1990 | Rzasa et al. | |
| 4,903,218 A | 2/1990 | Longo et al. | |
| 4,907,169 A | 3/1990 | Lovoi | |
| 4,908,874 A | 3/1990 | Gabriel | |
| 4,912,559 A | 3/1990 | Ariyoshi et al. | |
| 4,912,659 A | 3/1990 | Liang | |
| 4,914,553 A | 4/1990 | Hamada et al. | |
| 4,922,543 A | 5/1990 | Ahlbom et al. | |
| 4,924,086 A | 5/1990 | Weber | |
| 4,926,492 A | 5/1990 | Tanaka et al. | |
| 4,932,065 A | 6/1990 | Feldgajer | |
| 4,953,224 A | 8/1990 | Ichinose et al. | |
| 4,955,062 A | 9/1990 | Terui | |
| 4,959,898 A | 10/1990 | Landman et al. | |
| 4,962,423 A | 10/1990 | Yamada et al. | |
| 4,969,037 A | 11/1990 | Poleschinski et al. | |
| 4,972,359 A | 11/1990 | Silver et al. | |
| 4,982,438 A | 1/1991 | Usami et al. | |
| 5,005,126 A | 4/1991 | Haskin | |
| 5,012,402 A | 4/1991 | Akiyama | |
| 5,012,433 A | 4/1991 | Callahan et al. | |
| 5,012,524 A | 4/1991 | Le Beau | |
| 5,027,419 A | 6/1991 | Davis | |
| 5,046,190 A | 9/1991 | Daniel et al. | |
| 5,048,094 A | 9/1991 | Aoyama et al. | |
| 5,054,096 A | 10/1991 | Beizer | |
| 5,060,276 A | 10/1991 | Morris et al. | |
| 5,063,608 A | 11/1991 | Siegel | |
| 5,073,958 A | 12/1991 | Imme | |
| 5,081,656 A | 1/1992 | Baker et al. | |
| 5,081,689 A | 1/1992 | Meyer et al. | |
| 5,083,073 A | 1/1992 | Kato | |
| 5,086,478 A | 2/1992 | Kelly-Mahaffey et al. | |
| 5,090,576 A | 2/1992 | Menten | |
| 5,091,861 A | 2/1992 | Geller et al. | |
| 5,091,968 A | 2/1992 | Higgins et al. | |
| 5,093,867 A | 3/1992 | Hori et al. | |
| 5,113,565 A | 5/1992 | Cipolla et al. | |
| 5,115,309 A | 5/1992 | Hang | |
| 5,119,435 A | 6/1992 | Berkin | |
| 5,124,622 A | 6/1992 | Kawamura et al. | |
| 5,133,022 A | 7/1992 | Weideman | |
| 5,134,575 A | 7/1992 | Takagi | |
| 5,143,436 A | 9/1992 | Baylor et al. | |
| 5,145,432 A | 9/1992 | Midland et al. | |
| 5,151,951 A | 9/1992 | Ueda et al. | |
| 5,153,925 A | 10/1992 | Tanioka et al. | |
| 5,155,775 A | 10/1992 | Brown | |
| 5,159,281 A | 10/1992 | Hedstrom et al. | |
| 5,159,645 A | 10/1992 | Kumagai | |
| 5,164,994 A | 11/1992 | Bushroe | |
| 5,168,269 A | 12/1992 | Harlan et al. | |
| 5,175,808 A | 12/1992 | Sayre | |
| 5,179,419 A | 1/1993 | Palmquist et al. | |
| 5,185,810 A | 2/1993 | Freischlad | |
| 5,185,855 A | 2/1993 | Kato et al. | |
| 5,189,712 A | 2/1993 | Kajiwara et al. | |
| 5,204,944 A | 4/1993 | Wolberg et al. | |
| 5,206,820 A | 4/1993 | Ammann et al. | |
| 5,216,503 A | 6/1993 | Paik et al. | |
| 5,225,940 A | 7/1993 | Ishii et al. | |
| 5,230,027 A | 7/1993 | Kikuchi | |
| 5,243,607 A | 9/1993 | Masson et al. | |
| 5,253,306 A | 10/1993 | Nishio | |
| 5,253,308 A | 10/1993 | Johnson | |
| 5,259,038 A | 11/1993 | Sakou et al. | |
| 5,265,173 A | 11/1993 | Griffin et al. | |
| 5,271,068 A | 12/1993 | Ueda et al. | |
| 5,287,449 A | 2/1994 | Kojima | |
| 5,297,238 A | 3/1994 | Wang et al. | |
| 5,297,256 A | 3/1994 | Wolstenholme et al. | |
| 5,299,269 A | 3/1994 | Gaborski et al. | |
| 5,307,419 A | 4/1994 | Tsujino et al. | |
| 5,311,598 A | 5/1994 | Bose et al. | |
| 5,315,388 A | 5/1994 | Shen et al. | |
| 5,319,457 A | 6/1994 | Nakahashi et al. | |
| 5,327,156 A | 7/1994 | Masukane et al. | |
| 5,329,469 A | 7/1994 | Watanabe | |
| 5,337,262 A | 8/1994 | Luthi et al. | |
| 5,337,267 A | 8/1994 | Colavin | |
| 5,363,507 A | 11/1994 | Nakayama et al. | |
| 5,365,672 A | 11/1994 | Kato | |
| 5,367,439 A | 11/1994 | Mayer et al. | |
| 5,367,667 A | 11/1994 | Wahlquist et al. | |
| 5,371,690 A | 12/1994 | Engel et al. | |
| 5,371,836 A | 12/1994 | Mitomi et al. | |
| 5,381,004 A | 1/1995 | Uritsky et al. | |
| 5,388,197 A | 2/1995 | Rayner | |
| 5,388,252 A | 2/1995 | Dreste et al. | |
| 5,398,292 A | 3/1995 | Aoyama | |
| 5,432,525 A | 7/1995 | Maruo et al. | |
| 5,440,699 A | 8/1995 | Farrand et al. | |
| 5,455,870 A | 10/1995 | Sepai et al. | |
| 5,455,933 A | 10/1995 | Schieve et al. | |
| 5,471,312 A | 11/1995 | Watanabe et al. | |
| 5,475,766 A | 12/1995 | Tsuchiya et al. | |
| 5,475,803 A | 12/1995 | Stearns et al. | |
| 5,477,138 A | 12/1995 | Erjavic et al. | |
| 5,481,712 A | 1/1996 | Silver et al. | |
| 5,485,570 A | 1/1996 | Busboom et al. | |
| 5,491,780 A | 2/1996 | Fyles et al. | |
| 5,495,424 A | 2/1996 | Tokura | |
| 5,495,537 A | 2/1996 | Bedrosian et al. | |
| 5,496,106 A | 3/1996 | Anderson | |
| 5,497,007 A | 3/1996 | Uritsky et al. | |
| 5,500,906 A | 3/1996 | Picard et al. | |
| 5,506,617 A | 4/1996 | Parulski et al. | |
| 5,506,682 A | 4/1996 | Pryor | |
| 5,511,015 A | 4/1996 | Flockencier | |

| Patent No. | Date | Inventor |
|---|---|---|
| 5,519,840 A | 5/1996 | Matias et al. |
| 5,526,050 A | 6/1996 | King et al. |
| 5,528,703 A | 6/1996 | Lee |
| 5,532,739 A | 7/1996 | Garakani et al. |
| 5,539,409 A | 7/1996 | Mathews et al. |
| 5,544,256 A | 8/1996 | Brecher et al. |
| 5,548,326 A | 8/1996 | Michael |
| 5,550,763 A | 8/1996 | Michael |
| 5,550,888 A | 8/1996 | Neitzel et al. |
| 5,553,859 A | 9/1996 | Kelly et al. |
| 5,557,410 A | 9/1996 | Huber et al. |
| 5,557,690 A | 9/1996 | O'Gorman et al. |
| 5,559,904 A | 9/1996 | Holzmann |
| 5,566,877 A | 10/1996 | McCormack |
| 5,568,563 A | 10/1996 | Tanaka et al. |
| 5,574,668 A | 11/1996 | Beaty |
| 5,574,801 A | 11/1996 | Collet-Beillon |
| 5,581,632 A | 12/1996 | Koljonen et al. |
| 5,583,949 A | 12/1996 | Smith et al. |
| 5,583,954 A | 12/1996 | Garakani |
| 5,585,917 A | 12/1996 | Woite et al. |
| 5,586,058 A | 12/1996 | Aloni et al. |
| 5,592,562 A | 1/1997 | Rooks |
| 5,594,859 A | 1/1997 | Palmer et al. |
| 5,598,345 A | 1/1997 | Tokura |
| 5,602,937 A | 2/1997 | Bedrosian et al. |
| 5,608,490 A | 3/1997 | Ogawa |
| 5,608,872 A | 3/1997 | Schwartz et al. |
| 5,621,811 A | 4/1997 | Roder et al. |
| 5,627,915 A | 5/1997 | Rosser |
| 5,640,199 A | 6/1997 | Garakani et al. |
| 5,640,200 A | 6/1997 | Michael |
| 5,642,158 A | 6/1997 | Petry et al. |
| 5,647,009 A | 7/1997 | Aoki et al. |
| 5,649,032 A | 7/1997 | Burt et al. |
| 5,652,658 A | 7/1997 | Jackson et al. |
| 5,657,403 A | 8/1997 | Wolff et al. |
| 5,673,334 A | 9/1997 | Nichani et al. |
| 5,675,358 A | 10/1997 | Bullock et al. |
| 5,676,302 A | 10/1997 | Petry |
| 5,684,530 A | 11/1997 | White |
| 5,696,848 A | 12/1997 | Patti et al. |
| 5,715,369 A | 2/1998 | Spoltman et al. |
| 5,715,385 A | 2/1998 | Stearns et al. |
| 5,717,785 A | 2/1998 | Silver |
| 5,724,439 A | 3/1998 | Mizuoka et al. |
| 5,734,807 A | 3/1998 | Sumi |
| 5,739,846 A | 4/1998 | Gieskes |
| 5,739,913 A | 4/1998 | Wallace |
| 5,740,285 A | 4/1998 | Bloomberg et al. |
| 5,742,037 A | 4/1998 | Scola et al. |
| 5,751,853 A | 5/1998 | Michael |
| 5,754,679 A | 5/1998 | Kokjonen et al. |
| 5,757,956 A | 5/1998 | Koljonen et al. |
| 5,761,326 A | 6/1998 | Brady et al. |
| 5,761,337 A | 6/1998 | Nishimura et al. |
| 5,768,443 A | 6/1998 | Michael et al. |
| 5,793,899 A | 8/1998 | Wolff et al. |
| 5,796,386 A | 8/1998 | Lipscomb et al. |
| 5,796,868 A | 8/1998 | Dutta-Choudhury et al. |
| 5,801,966 A | 9/1998 | Ohashi |
| 5,805,722 A | 9/1998 | Cullen et al. |
| 5,809,658 A | 9/1998 | Jackson et al. |
| 5,818,443 A | 10/1998 | Schott |
| 5,822,055 A | 10/1998 | Tsai et al. |
| 5,825,483 A | 10/1998 | Michael et al. |
| 5,825,913 A | 10/1998 | Rostami et al. |
| 5,835,099 A | 11/1998 | Marimont |
| 5,835,622 A | 11/1998 | Koljonen et al. |
| 5,845,007 A | 12/1998 | Ohashi et al. |
| 5,847,714 A | 12/1998 | Naqvi et al. |
| 5,848,189 A | 12/1998 | Pearson et al. |
| 5,850,466 A | 12/1998 | Schott et al. |
| 5,859,923 A | 1/1999 | Petry et al. |
| 5,861,909 A | 1/1999 | Garakani et al. |
| 5,870,495 A | 2/1999 | Mancuso et al. |
| 5,872,870 A | 2/1999 | Michael |
| 5,878,152 A | 3/1999 | Sussman |
| 5,900,975 A | 5/1999 | Sussman |
| 5,901,241 A | 5/1999 | Koljonen |
| 5,909,504 A | 6/1999 | Whitman |
| 5,912,768 A | 6/1999 | Sissom et al. |
| 5,912,984 A | 6/1999 | Michael et al. |
| 5,918,196 A | 6/1999 | Jacobson et al. |
| 5,933,523 A | 8/1999 | Drisko et al. |
| 5,943,441 A | 8/1999 | Michael |
| 5,949,901 A | 9/1999 | Nichani et al. |
| 5,953,130 A | 9/1999 | Benedict |
| 5,960,125 A | 9/1999 | Michael et al. |
| 5,974,169 A | 10/1999 | Bachelder |
| 5,974,365 A | 10/1999 | Mitchell |
| 5,978,081 A | 11/1999 | Michael et al. |
| 5,978,502 A | 11/1999 | Ohashi |
| 5,978,521 A | 11/1999 | Wallack et al. |
| 5,982,132 A | 11/1999 | Colby |
| 6,002,738 A | 12/1999 | Cabral et al. |
| 6,002,793 A | 12/1999 | Silver et al. |
| 6,016,152 A | 1/2000 | Dickie |
| 6,025,854 A | 2/2000 | Hinz et al. |
| 6,025,905 A | 2/2000 | Sussman |
| 6,026,176 A | 2/2000 | Whitman |
| 6,067,379 A | 5/2000 | Silver |
| 6,069,668 A | 5/2000 | Woodham et al. |
| 6,075,881 A | 6/2000 | Foster et al. |
| 6,084,631 A | 7/2000 | Tonkin et al. |
| 6,118,540 A | 9/2000 | Roy et al. |
| 6,137,893 A | 10/2000 | Michael et al. |
| 6,141,033 A | 10/2000 | Michael et al. |
| 6,141,040 A | 10/2000 | Toh |
| 6,170,973 B1 | 1/2001 | Benedict |
| 6,188,784 B1 | 2/2001 | Linker et al. |
| 6,191,850 B1 | 2/2001 | Chiang |
| 6,215,915 B1 | 4/2001 | Reyzin |
| 6,236,769 B1 | 5/2001 | Desai |
| 6,259,827 B1 | 7/2001 | Nichani |
| 6,275,742 B1 * | 8/2001 | Sagues et al. ............... 700/213 |
| 6,282,328 B1 | 8/2001 | Desai |
| 6,298,149 B1 | 10/2001 | Nichani et al. |
| 6,301,396 B1 | 10/2001 | Michael |
| 6,341,878 B1 | 1/2002 | Chiang |
| 6,381,366 B1 | 4/2002 | Taycher et al. |
| 6,381,375 B1 | 4/2002 | Reyzin |
| 6,389,029 B1 | 5/2002 | McAlear |
| 6,396,949 B1 | 5/2002 | Nichani |
| 6,442,291 B1 | 8/2002 | Whitman |
| 6,477,275 B1 | 11/2002 | Melikian et al. |
| 6,516,092 B1 | 2/2003 | Bachelder et al. |
| 6,639,624 B1 | 10/2003 | Bachelder et al. |
| 6,658,145 B1 | 12/2003 | Silver et al. |
| 6,684,402 B1 | 1/2004 | Wolff |
| 6,728,582 B1 | 4/2004 | Wallack |
| 6,748,104 B1 | 6/2004 | Bachelder et al. |
| 6,771,808 B1 | 8/2004 | Wallack |
| 6,850,646 B1 | 2/2005 | Silver |
| 6,856,698 B1 | 2/2005 | Silver et al. |
| 6,900,877 B2 | 5/2005 | Raaijmakers |
| 6,914,679 B2 | 7/2005 | Nettekoven et al. |
| 6,933,172 B2 * | 8/2005 | Tomimatsu ............... 438/109 |
| 7,006,669 B1 | 2/2006 | Lavagnino et al. |
| 7,042,568 B2 | 5/2006 | Mayo |
| 7,048,400 B2 * | 5/2006 | Murasko et al. ............... 362/84 |
| 7,225,734 B2 | 6/2007 | Schanz |

| | | | |
|---|---|---|---|
| 7,295,314 B1 | 11/2007 | Spady et al. | |

FOREIGN PATENT DOCUMENTS

| | | |
|---|---|---|
| EP | 2598019 | 10/1987 |
| EP | 0341122 | 4/1989 |
| EP | 0527632 | 2/1993 |
| EP | 0777381 | 2/1999 |
| EP | 0895696 | 2/1999 |
| WO | WO9110968 | 7/1991 |
| WO | WO9511491 | 4/1995 |
| WO | WO9521376 | 8/1995 |
| WO | WO9522137 | 8/1995 |
| WO | WO9721189 | 6/1997 |
| WO | WO9722858 | 6/1997 |
| WO | WO9724692 | 7/1997 |
| WO | WO9724693 | 7/1997 |
| WO | WO9739416 | 10/1997 |
| WO | WO9830890 | 7/1998 |
| WO | WO9852349 | 11/1998 |
| WO | WO9859490 | 12/1998 |
| WO | WO9915864 | 4/1999 |
| WO | WO9927456 | 6/1999 |
| WO | WO9948000 | 9/1999 |

OTHER PUBLICATIONS

Ray, R. "Automated inspection of solder bumps using visual signatures of specular image-highlights", *Computer Vision and Pattern Recognition, Proceedings CVPR*, (1989),588 - 596.

Wu, Yifeng et al., "Registration of a SPOT Image and a SAR Image Using Multiresolution Representation of a Coastline", *10th International Conference of pattern Recognition*, (Jun. 16 - 21, 1990),913 - 917.

* cited by examiner

METHOD AND APPARATUS FOR BACKLIGHTING A WAFER DURING ALIGNMENT

BACKGROUND OF THE INVENTION

This invention relates to illumination of a silicon wafer when using a machine vision system to obtain alignment characteristics of the wafer.

Silicon wafer fabrication is generally described as a series of sequential photo-chemical processing steps that create an array of semiconductor devices. The silicon wafer, the substrate upon which the semiconductor devices are fabricated, is a flat single monocrystal of silicon. It is typically in the shape of a circle of diameter 150 mm, 200 mm or 300 mm. The various wafer fabrication processing steps require precise alignment of the silicon wafer. Precise alignment may be required for a particular processing step because that step depends on precise crystal alignment either for manufacturing efficacy or manufacturing repeatability such as an ion beam deposition step. Alternatively, precise alignment may be required because a particular processing step is pattern-dependent and needs to be photographically registered with one of the previous steps such as a photolithography step.

In order to facilitate this precise alignment, wafers are manufactured to agreed upon standards with specific features. For example, SEMI M1-0305 Specifications for Polished Monocrystalline Silicon Wafers defines some of these standards and describes notches or flats cut into the outside perimeter of the wafer permitting wafer orientation to be determined by examination of the wafer perimeter.

Wafer Prealignment (sometimes called Wafer Coarse Alignment) is an automated process of examining the shape of a silicon wafer and its notches, flats or other geometric shape characteristics to determine the alignment of a wafer. Alignment of the wafer means determining the position and orientation of the wafer relative to a particular coordinate system. The physical positional accuracy of such an alignment could range from a fraction of a micron to a few millimeters in position and from a few thousands of a degree to a degree or two in orientation. It is possible for some of the processing steps described above to involve creating fiducial marks on the surface of the wafer. In later processing steps, those newly created fiducial marks can also be used for wafer alignment. Such a wafer alignment step that uses fiducial marks on the surface of the wafer is called a fine alignment step and is not the subject of this application. However, it is important to note that even when a fine alignment step is performed to align a wafer, a coarse alignment step is typically performed first in order to reduce the search area of the fiducial mark.

Conventional wafer alignment systems and methods employ LED illumination that provides backlight illumination of the wafer. To provide the requisite uniform diffuse illumination, the LED illuminators require a diffuser that distributes the point source illumination of the LED into a wide area diffused mode of illumination proximate to the peripheral region of the wafer. While effective, the conventional illumination systems and methods become increasingly complex and expensive as the wafer fabrication industry continues in its trend toward larger wafer sizes.

Accordingly, there is a need for a low cost method and apparatus for providing uniform and diffuse illumination over a wide area for backlighting wafers during coarse alignment.

BRIEF SUMMARY OF THE INVENTION

The invention provides a method and apparatus for backlighting a wafer during wafer alignment processing. In a particular embodiment, the invention provides illumination using a sheet of electroluminescent material to backlight a wafer. An image of the backlit wafer is acquired using a camera coupled to a machine vision system. In this embodiment, the wafer is positioned on a stage, and the position and orientation of the wafer can be determined from the image.

In accordance with the principles of the present invention, the sheet of electroluminescent material can be operated while adhered to a rigid substrate and applying electrical power. Alternate embodiments of the invention include the use of a robotic end effector to position the wafer between the electroluminescent lamp and the camera. In this embodiment, the wafer can be held stationary during image acquisition, or dynamically moved through the field of view. Alternatively, the electroluminescent material can be operated in a strobed mode of operation by momentarily cycling the power application when the wafer is in the field of view of the camera.

BRIEF DESCRIPTION OF THE SEVERAL VIEWS OF THE DRAWINGS

The invention will be more fully understood from the following detailed description, in conjunction with the following figures, wherein.

DETAILED DESCRIPTION OF THE INVENTION

Figure 1:
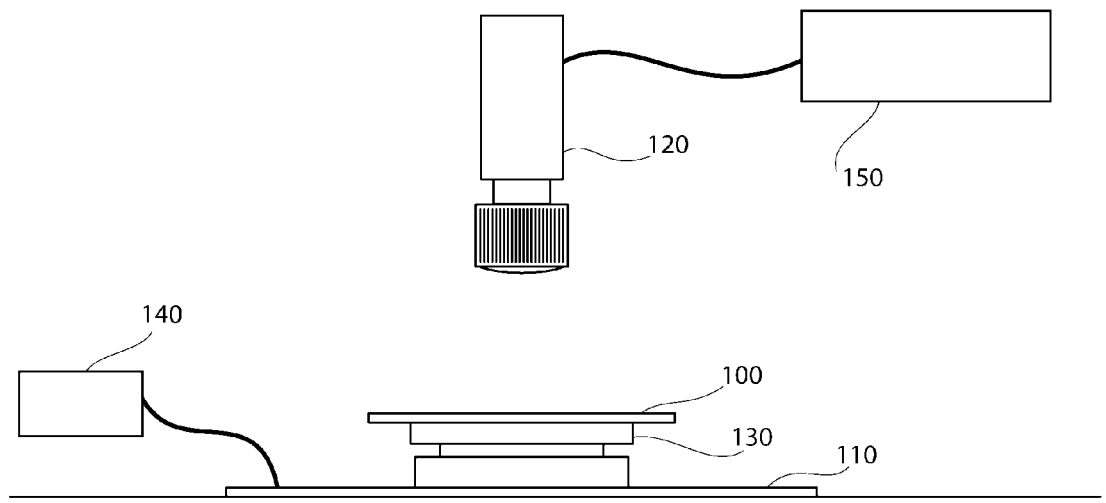
FIG. 1 is an illustrative diagram of an exemplary wafer alignment system according to the present invention.

Referring to FIG. 1, in accordance with the present invention, there is provided a wafer alignment system that can be deployed in a wafer fabrication process for providing coarse alignment of a silicon wafer. A silicon wafer 100 is presented to a machine vision camera 120 using an alignment stage 130. An electroluminescent lamp 110 projects illumination toward the camera 120 to provide backlight illumination of the wafer 100 through the application of power from a power supply 140.

In an embodiment of the invention, a robot end effector or a person places the wafer 100 upon the alignment stage 130. The wafer can be inaccurately placed on the stage and can have any orientation—the objective of the wafer alignment process is to determine the relative position and angular orientation of the wafer 100 to a reference location or position, so that an automated material transfer system, like a robotic end effector, can accurately pick up and transfer the wafer using the determined relative positional information.

In the wafer alignment process using the present invention, a machine vision system 150 acquires at least one image of the wafer on the alignment stage using the camera 120. In an illustrative embodiment, the machine vision system is a personal computer with a frame grabber, like the MVS-8100 PCI frame grabber available from Cognex Corporation. The camera 120 can be an RS-170/CCIR industry standard 640×480 monochrome camera, coupled to the machine vision system 150 using standard video interconnection cables. Alternatively, the camera 120 and the machine vision system 150 can be an integrated sensor, for example, an In-Sight 1700 Series Wafer Reader, also available from Cognex Corporation, where the functionality of the camera 120 is internally coupled to the machine vision system 150. In a clean-room environment, the integrated camera/system solution will be preferred.

Figure 3:
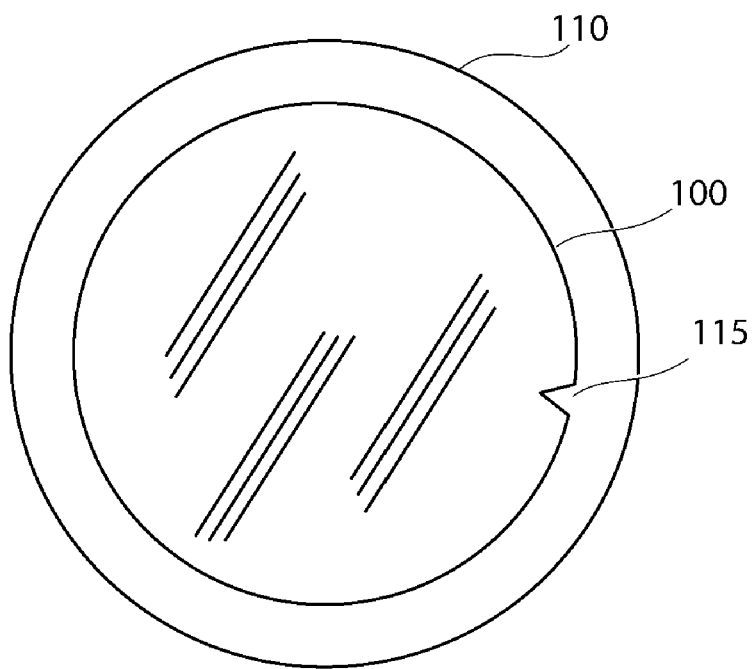
FIG. 3 is a representation of an image of the wafer acquired during wafer alignment according to the present invention.

The acquired image of the wafer 100, backlit by the electroluminescent lamp 110, is represented by FIG. 3. An apparent edge is visible in the image between the electroluminescent lamp 110 and the wafer 100; the lamp 110 will appear bright, while the wafer 100 will appear dark. Using boundary tracking methods of fitting a circle template to the image of the wafer 100, a center position of the wafer can be determined. The angular orientation of the wafer can be determined by finding the notch 115, using conventional pattern matching or correlation matching tools commonly known in the art. In 200 mm wafer fabrication implementations, the notch 115 may appear as a short chord feature, or "flat" in the circular profile of the wafer, though the same, or similar, feature locating methods can be similarly applied. One method of performing the machine vision methods for determining the position and orientation of wafer using an acquired backlit image of the wafer is described in commonly assigned U.S. Pat. No. 5,825,913, the entirety of which is herein incorporated by reference.

Figure 2:
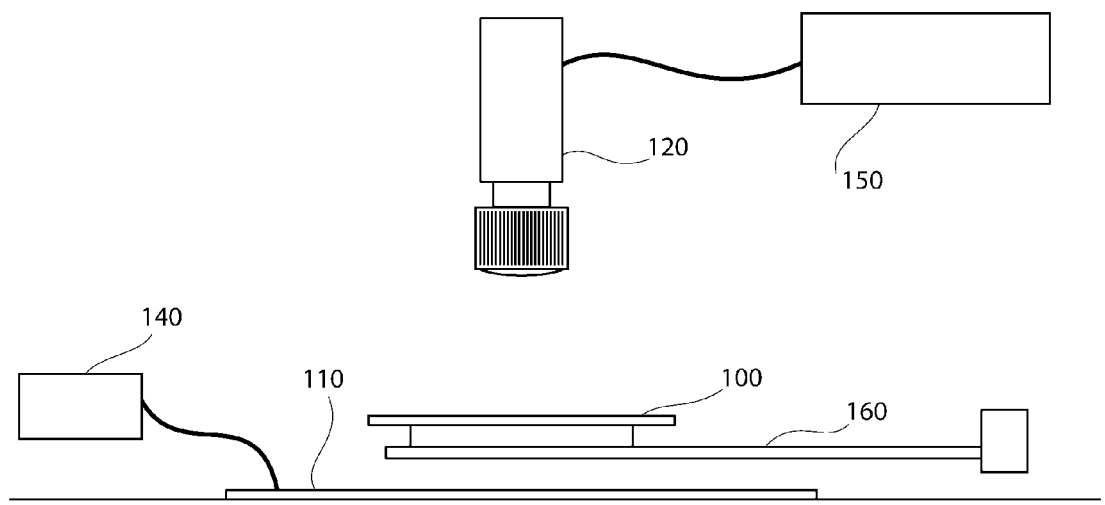
FIG. 2 is an illustrative diagram of an alternative exemplary wafer alignment system according to the present invention.

In an alternate embodiment of the invention shown in FIG. 2, a robot end effector 160 passes the wafer between the lamp 110 and the camera 120 so that the wafer alignment process can be performed, with the determined wafer position and orientation passed to the robot controller. The wafer alignment process in this embodiment is the same as that described above with reference to the camera 120 coupled to the machine vision system 150, or through the use of an integrated sensor. In this alternate embodiment, features of the robot end effector 160, typically a vacuum grip or edge grip configuration, will appear in the acquired image. The wafer alignment process must be tolerant of these extraneous features, and there is the possibility that the notch or flat features may be obscured by the robot end effector 160. In this embodiment, the robot end effector 160 may pause in the predetermined position so that the wafer alignment process can be performed, or the image can be acquired as the end effector 160 dynamically passes the wafer through the predetermined position. In the latter configuration, a strobed actuation of the lamp 110 is preferred, by momentarily actuating the power supply 140, as described below.

Figure 4:
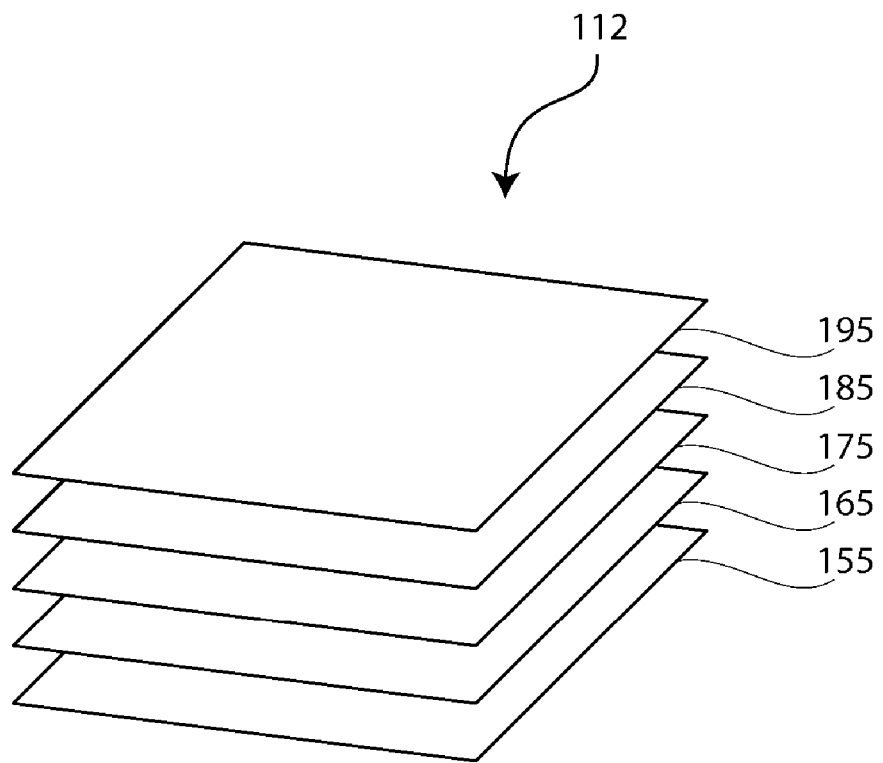
FIG. 4 is an exploded view of the electroluminescent material according to the present invention.

An exploded view of a section of the electroluminescent material 112 used in the electroluminescent lamp 110 is shown in FIG. 4. A thin layer of light emitting phosphor 185 is placed between a translucent electrode 195 and an opaque electrode 175. When alternating current (400-1600 Hz) is applied to the translucent electrode 195 and the opaque electrode 175, the phosphor layer 185 rapidly charges and discharges, resulting in the emission of light. An insulating layer 165 electrically isolates the active layers of the composite structure from the base structural material 155. The typical thickness of the electroluminescent material is approximately 0.30+/−0.03 mm.

Figure 5:
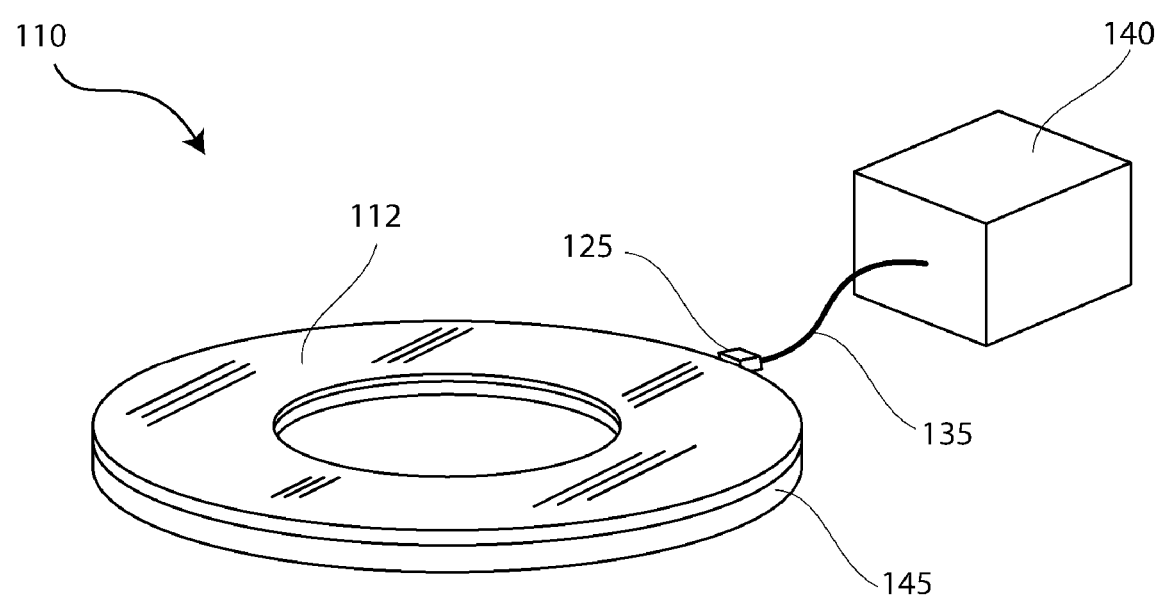
FIG. 5 is an isometric view of the electroluminescent lamp according to an illustrative embodiment of the present invention.

An illustrative embodiment of the present invention is shown in FIG. 5. The electroluminescent lamp 110 is fabricated by attaching the electroluminescent material 112, which is typically flexible, to a rigid substrate 145. The electroluminescent material can be obtained from MKS, Bridgeton, N.J., as Quantaflex 1600. The rigid substrate material 145 can be, for example, polycarbonate, or any similar material that is suitable for use in a wafer fabrication clean-room environment, such as G10 epoxy-glass composites, or anodized aluminum. To attach the electroluminescent material 112 to the rigid substrate 145, an adhesive suitable for use in a wafer fabrication clean-room environment, such as Dymax "Multi-cure 427", UV cured epoxy. Electrical power supplied from the power supply 140 is connected to the electroluminescent material 112 via a cable 135 that is attached using a suitable connector 125 in a manner specified by the material provider. During operation, the power applied to the lamp 110 is 60-120 Volts AC at 400-800 Hz. As shown in FIG. 5, the illustrative embodiment of the present invention is a circular shape in an annular ring, with a void area in the center to accommodate the wafer stage 130. In the illustrative embodiment, which is sufficient for illuminating a 300 mm wafer, the lamp is approximately fourteen inches in diameter overall with an six inch center diameter. One skilled in the art will appreciate that nearly any geometric shape is suitable for the design of the lamp 110, so long as the expected edge of the wafer 100 is illuminated in the field of view of the camera 120 by the lamp 110.

During operation, the power supply 140 supplies alternating current to the translucent electrode layer 195 and the opaque electrode layer 175 so that light emits from the surface of the lamp 110. In a static wafer alignment process, the power supply continuously applies current to the lamp 110 during image acquisition. Alternatively, in either a static analysis, or in an implementation according to the alternate embodiment wherein an end effector dynamically passes the wafer through the field of view of the camera 120, the power supply can strobe the lamp 110 with an intermittent actuation in response to a system trigger. In a strobed implementation, the power can be optionally overdriven according to manufacturer specification to increase illumination intensity over a short duration, at the expense of potential reduction in expected life cycle of the lamp. When strobing power supplied to the lamp, the latency is reasonably predictable over the area of illumination, which can be calibrated with the system timing requirements.

One skilled in the art will appreciate that variations to the illustrative embodiment can be contemplated within the purview of the appended claims. For example, the electroluminescent material 112 can be captured between a sheet of transparent glass, quartz, or plastic and a substrate. The flexible material need only be held relatively flat on a plane substantially parallel to the surface of the wafer under alignment so that its perceived illumination is evenly distributed over the area at the expected edge of the wafer in the field of view of the camera 120. Since the illumination output from the material is highly efficient, the material does not generate thermal management issues with respect to the construction or particular design of the electroluminescent lamp 110.

The electroluminescent material can be obtained in any of a variety of illumination colors. In the illustrative embodiment of the present invention, a lime-green color has been selected, since it has been found to be non-reactive to semiconductor fabrication processes that are associated with, or in near proximity to, the wafer alignment processes.

The illustrative embodiment has been shown to be effective for wafer alignment even in installations where ambient light is not controlled. Reflection of ambient light from the lamp 110 can be distinguished from specular reflections of ambient light from the wafer under alignment by the machine vision system 150 such that sufficient contrast at the wafer edge can permit an effective analysis of an acquired image. Alternatively, a band-pass filter (not shown) that is tuned to the wavelength (color) of the light projected from electroluminescent material 112 can be installed in the optical path of the camera 120 to reduce the potential for susceptibility of ambient light reflections.

While the invention has been described with reference to certain illustrated embodiments, the words which have been used herein are words of description rather than words of limitation. Changes may be made, within the purview of the appended claims, without departing from the scope and spirit of the invention and its aspects. Although the invention has been described herein with reference to particular structures, acts and material, the invention is not to be limited to the particulars disclosed, but rather extending to all equivalent structures, acts, and materials, such as are within the scope of the appended claims.

What is claimed is:

1. An apparatus for backlighting a wafer during alignment comprising:
   a wafer alignment stage;
   a camera coupled to a machine vision system, the camera positioned to acquire an image of a wafer placed on the wafer alignment stage; and
   an electroluminescent lamp projecting illumination toward the camera, the wafer alignment stage disposed between the camera and the electroluminescent lamp.

2. The apparatus according to claim 1 wherein the electroluminescent lamp further comprises: a rigid substrate; a sheet of electroluminescent material adhesively attached to the substrate; and a power supply electrically coupled to the electroluminescent material.

3. The apparatus according to claim 2 wherein the electroluminescent lamp has a circular annular shape.

4. The apparatus according to claim 2 wherein the rigid substrate is an epoxy-glass composite.

5. The apparatus according to claim 1 wherein the electroluminescent lamp emits illumination in a particular color, and the camera further comprises a band-pass filter tuned to the particular color of the electroluminescent lamp.

6. The apparatus according to claim 1 wherein the camera coupled to the machine vision system is an integrated sensor.

7. An apparatus for backlighting a wafer during alignment comprising:
   a robot end effector;
   a camera coupled to a machine vision system, the camera positioned to acquire an image of a wafer placed on the robot end effector; and
   an electroluminescent lamp projecting illumination toward the camera, the wafer disposed between the camera and the electroluminescent lamp.

8. The apparatus according to claim 7 wherein the electroluminescent lamp further comprises:
   a rigid substrate;
   a sheet of electroluminescent material adhesively attached to the substrate; and
   a power supply electrically coupled to the electroluminescent material.

9. The apparatus according to claim 8 wherein the electroluminescent lamp has a circular annular shape.

10. The apparatus according to claim 8 wherein the rigid substrate is an epoxy-glass composite.

11. The apparatus according to claim 7 wherein the electroluminescent lamp emits illumination in a particular color, and the camera further comprises a band-pass filter tuned to the particular color of the electroluminescent lamp.

12. The apparatus according to claim 7 wherein the camera coupled to the machine vision system is an integrated sensor.

13. A method for backlighting a wafer during alignment comprising:
   positioning a wafer in a field of view of a camera, the wafer having a first side facing the camera and a second side facing away from the camera, the camera cooperatively coupled to a machine vision system;
   illuminating the second side of the wafer using an electroluminescent lamp and a portion of the field of view; and
   determining the position and orientation of the wafer using the acquired image and the machine vision system.

14. The method according to claim 13 wherein the step of positioning the wafer comprises placing the wafer on a stage.

15. The method according to claim 13 wherein the step of positioning the wafer comprises moving the wafer through the field of view using a robotic end effector.

16. The method according to claim 15 wherein the step of illuminating the second side of the wafer comprises strobing the electroluminescent lamp.

* * * * *